US009726536B2

(12) United States Patent
Bachar et al.

(10) Patent No.: US 9,726,536 B2
(45) Date of Patent: Aug. 8, 2017

(54) FIBER OPTICAL SUPERCONDUCTING NANOWIRE SINGLE PHOTON DETECTOR

(71) Applicant: TECHNION RESEARCH & DEVELOPMENT FOUNDATION LTD., Haifa (IL)

(72) Inventors: Gil Bachar, Tel-Aviv (IL); Oleg Shtempluck, Haifa (IL); Eyal Buks, Haifa (IL)

(73) Assignee: TECHNION RESEARCH AND DEVELOPMENT FOUNDATION LIMITED, Haifa (IL)

( * ) Notice: Subject to any disclaimer, the term of this patent is extended or adjusted under 35 U.S.C. 154(b) by 391 days.

(21) Appl. No.: 14/366,705

(22) PCT Filed: Dec. 23, 2012

(86) PCT No.: PCT/IL2012/000397
§ 371 (c)(1),
(2) Date: Jun. 19, 2014

(87) PCT Pub. No.: WO2013/093905
PCT Pub. Date: Jun. 27, 2013

(65) Prior Publication Data
US 2014/0353476 A1     Dec. 4, 2014

Related U.S. Application Data

(60) Provisional application No. 61/579,659, filed on Dec. 23, 2011.

(51) Int. Cl.
*G01J 1/04*     (2006.01)
*G01J 1/42*     (2006.01)
(Continued)

(52) U.S. Cl.
CPC ............ *G01J 1/0425* (2013.01); *G01B 11/00* (2013.01); *G01J 1/42* (2013.01); *H01L 39/12* (2013.01);
(Continued)

(58) Field of Classification Search
CPC ......... G01B 11/00; H01L 39/16; H01L 39/12; H01L 39/2416; G01J 1/0425; G01J 1/42;
(Continued)

(56) References Cited

U.S. PATENT DOCUMENTS 5,042,897 A      8/1991   Meltz et al.
5,070,241 A  *  12/1991   Jack .......................... G01J 5/10
                                                                   250/336.1
(Continued)

OTHER PUBLICATIONS

PCT International Search Report and Written Opinion of the ISA, mailed on Apr. 14, 2013 in PCT/IL/2012/000397.
(Continued)

*Primary Examiner* — John Lee
(74) *Attorney, Agent, or Firm* — Daniel J. Swirsky; AlphaPatent Associates Ltd.

(57) ABSTRACT

A fiber optical superconducting nanowire detector with increased detector efficiency, fabricated directly on the tip of the input optical fiber. The fabrication on the tip of the fiber allows precise alignment of the detector to the fiber core, where the field mode is maximal. This construction maximizes the coupling efficiency to close to unity, without the need for complex alignment procedures, such as the need to align the input fiber with a previously fabricated device. The device includes a high-Q optical cavity, such that any photon entering the device will be reflected to and fro within the cavity numerous times, thereby increasing its chances of absorption by the nanowire structure. This is achieved by using dedicated cavity mirrors with very high reflectivity, with the meander nanowire structure contained within the
(Continued)

cavity between the end mirrors, such that photons impinge on the nanowire structure with every traverse of the cavity.

21 Claims, 4 Drawing Sheets

(51) Int. Cl.
    *G01B 11/00*     (2006.01)
    *H01L 39/12*     (2006.01)
    *H01L 39/16*     (2006.01)
    *H01L 39/24*     (2006.01)
    *G02B 6/38*     (2006.01)
    *G02B 6/42*     (2006.01)
    *G02B 6/02*     (2006.01)

(52) U.S. Cl.
    CPC .......... *H01L 39/16* (2013.01); *H01L 39/2416* (2013.01); *G02B 6/02209* (2013.01); *G02B 6/3845* (2013.01); *G02B 6/4203* (2013.01)

(58) Field of Classification Search
    CPC . G02B 6/3845; G02B 6/4203; G02B 6/02209
    See application file for complete search history.

(56) References Cited

U.S. PATENT DOCUMENTS

| | | | | |
|---|---|---|---|---|
| 6,812,464 | B1* | 11/2004 | Sobolewski | H01L 39/10 250/336.2 |
| 6,873,638 | B2 | 3/2005 | Haase et al. | |
| 7,049,593 | B2* | 5/2006 | Sobolewski | H01L 39/10 250/336.2 |
| 7,638,751 | B2* | 12/2009 | Dauler | G01J 1/02 250/214 R |
| 7,718,964 | B2* | 5/2010 | Frey | G01J 1/02 250/336.2 |
| 7,763,854 | B2* | 7/2010 | Frey | G01J 1/02 250/336.2 |
| 7,791,065 | B2* | 9/2010 | Frey | B82Y 20/00 250/336.2 |
| 7,928,386 | B2* | 4/2011 | Frey | B82Y 20/00 250/336.2 |
| 8,565,844 | B2* | 10/2013 | Smith | G01J 5/023 505/160 |
| 8,577,430 | B1* | 11/2013 | Smith | G01J 1/42 505/160 |
| 8,761,848 | B2* | 6/2014 | Berggren | G01J 1/42 505/160 |
| 9,000,354 | B2* | 4/2015 | Woodward | G01J 1/42 250/227.11 |
| 9,054,247 | B2* | 6/2015 | Mohseni | H01L 31/035236 |
| 9,076,907 | B2* | 7/2015 | Englund | G01J 1/42 |
| 9,240,539 | B2* | 1/2016 | Nam | G01J 1/42 |
| 2003/0218143 | A1* | 11/2003 | Shields | B82Y 20/00 250/493.1 |
| 2005/0051726 | A1* | 3/2005 | Sobolewski | H01L 39/10 250/336.2 |
| 2008/0197285 | A1* | 8/2008 | Frey | B82Y 20/00 250/336.2 |
| 2008/0272302 | A1* | 11/2008 | Frey | B82Y 20/00 250/336.2 |
| 2009/0020701 | A1* | 1/2009 | Frey | G01J 1/02 250/336.2 |
| 2009/0050790 | A1* | 2/2009 | Dauler | G01J 1/02 250/214 R |
| 2011/0222570 | A1 | 9/2011 | Junesand et al. | |
| 2012/0077680 | A1* | 3/2012 | Berggren | G01J 1/42 505/160 |
| 2013/0172195 | A1* | 7/2013 | Bellei | G01J 1/42 505/160 |
| 2013/0341594 | A1* | 12/2013 | Mohseni | H01L 31/035236 257/21 |
| 2014/0299751 | A1* | 10/2014 | Tang | G01J 1/0425 250/227.11 |
| 2014/0353476 | A1* | 12/2014 | Bachar | G01B 11/00 250/227.24 |
| 2015/0117826 | A1* | 4/2015 | Mazur | G02F 1/355 385/124 |
| 2015/0287870 | A1* | 10/2015 | Mohseni | H01L 31/035236 257/184 |

OTHER PUBLICATIONS

Hu et al, Efficiently Coupling Light to Superconducting Nanowire Single-Photon Detectors, IEEE Trans. on Appl. Supercon., Jun. 1, 2009, pp. 336-340, vol. 19.

Qui et al, Nonpigtail optical coupling to embedded fiber Bragg grating sensors, Opt. Eng., May 18, 2010, vol. 49(5), 054402.

P. LeCoupanec et al, An Ultra-low Dark-count and Jitter, Superconducting Single Photon Detector for Emission Timing Analysis of Integrated Circuits, Microelectrics Reliability, Sep.-Nov. 2003, pp. 1621-1626, vol. 43.

K.M. Rosfjord et al, Nanowire Single Photon Detector with an Integrated Optical Cavity and Antireflection Coating, Optics Express, 2006, pp. 527-534, vol. 14 No. 2.

Anant et al, Optical Properties of Superconducting Nanowire Single-Photon Detectors, Optics Express, 2008, pp. 10750-10761, vol. 16.

S. Miki et al, Multi-Channel SNSPD System with High Detection Efficiency at Telecommunication Wavelength, Optics Letters, 2010. pp. 2133-2135, vol. 35 No. 13.

B. Baek et al, Superconducting a-WxSi1-x Nanowire Single-Photon Detector with Saturated Internal Quantum Efficiency from Visible to 1850 NM, Applied Physics Letters, Jun. 21, 2011, vol. 98, 251105.

A. Miller et al, Compact Cryogenic Self-Aligning Fiber-to-Detector Coupling with Losses Below One Percent, Optics Express, May 9, 2011, pp. 9102-9110, vol. 19 No. 10.

* cited by examiner

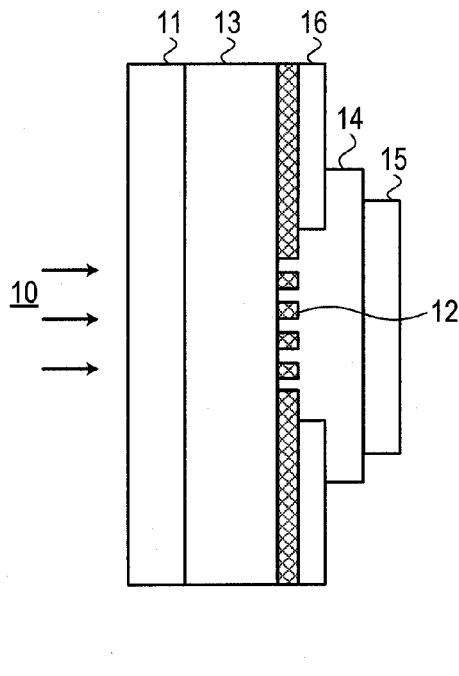
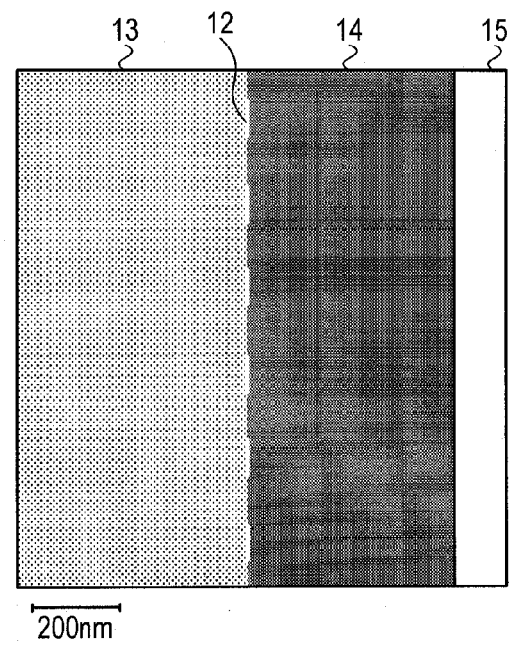
FIG. 1A (PRIOR ART)  FIG. 1B (PRIOR ART)
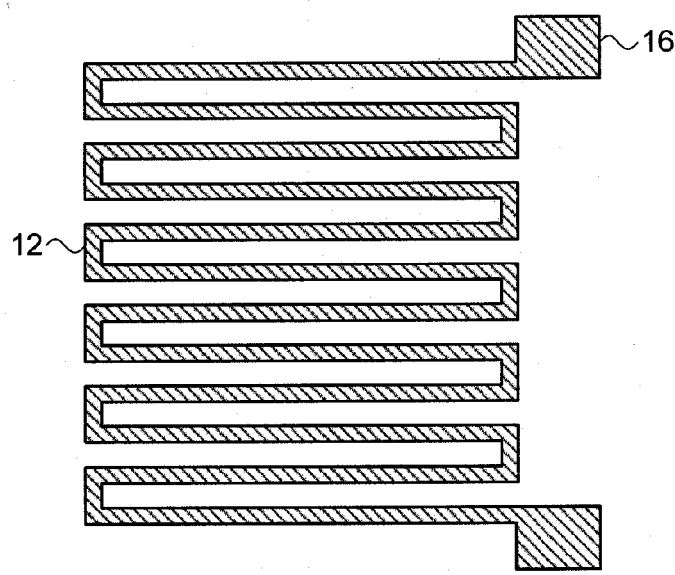
FIG. 1C (PRIOR ART)

FIBER OPTICAL SUPERCONDUCTING NANOWIRE SINGLE PHOTON DETECTOR

CROSS-REFERENCE TO RELATED APPLICATIONS

This application is a U.S. National Phase Application under 35 U.S.C. 371 of International Application No. PCT/IL2012/000397, which has an international filing date of Dec. 23, 2012, and which claims the benefit of priority of U.S. Provisional Patent Application No. 61/579,659, filed Dec. 23, 2011, the disclosures of which are incorporated herein by reference in their entirety.

FIELD OF THE INVENTION

The present invention relates to the field of low level light detectors, especially those based on the superconducting nanowire single photon detection effect.

BACKGROUND OF THE INVENTION

Sensitive light detectors are needed in various fields, such as quantum communication, space communication, astronomy, motion detection, molecule sequencing and others. The ultimate light sensitivity is reached when detecting a single quantum of light, the photon. Achieving reliable single photon detection at a high rate requires a high detection efficiency, a fast response, as well as negligible dark counts. Superconducting nanowire single photon detectors (SNSPD) currently are one of the devices used to provide such performance. Such SNSPDs are typically constructed of a thin ($\approx 5$ nm) and narrow ($\approx 100$ nm) superconducting nanowire, generally formed on a substrate such as silicon, sapphire, magnesium oxide, glass or the like, by means of conventional microelectronic fabrication techniques. The length is typically hundreds of microns, and the nanowire is patterned in a compact meander geometry to create a square or circular pixel with high area filling factor. The nanowire is cooled below its superconducting critical temperature and biased with a DC current that is close to but less than the superconducting critical current of the wire. The detection mechanism utilizes a fast avalanche process, in which an absorbed photon incident on the nanowire breaks hundreds of Cooper pairs and reduces the local critical current below that of the bias current. This results in the formation of a localized non-superconducting region, or hotspot, with finite electrical resistance. This resistance is generally larger than the load resistance (typically of 50 ohm), and hence most of the bias current is shunted to the load resistor. This produces a measurable voltage pulse that is approximately equal to the bias current multiplied by the load resistance (typically 50 ohms). With most of the bias current now flowing through the load resistor, the non-superconducting region cools and returns to the superconducting state. The time for the current to return to the nanowire is typically set by the inductive time constant of the nanowire, equal to the kinetic inductance of the nanowire divided by the impedance of the load resistor. Proper self-resetting of the device requires that this inductive time constant be slower than the intrinsic cooling time of the nanowire hotspot. However, the reset time should be kept to the minimum imposed by this limit; the detection time is inversely proportional to the detection rate. Hence, detector length should be kept to minimum to decrease the inductive time. Typical reset time scales of SNSPDs can be of the order of tens of picoseconds, requiring detection rates of well over the GHz. range. Current SNSPDs can thus provide fast response, as well as negligible dark counts, but suffer from detection efficiencies well below 100%.

The detection efficiency $\eta$, also referred to as the quantum efficiency, is defined as the percentage of photons detected by the detector, out of those received. The detection efficiency can be calculated as $\eta = \eta_C \times \eta_A \times \eta_P$, where: the coupling efficiency $\eta_C$ is the percentage of photons impinging on the detector element itself out of those received at the optical input, the absorption efficiency $\eta_A$ is the percentage of photons absorbed in the detector out of those impinging on it, and the pulse efficiency $\eta_P$ is the percentage of photons creating a pulse out of those absorbed.

There are several prior art means of inputting light to be detected by the detector. One type of prior art detector systems input the light by means of free space coupling between the detector and the source, using complex lens systems. Other systems input light from a fiber. In order to ensure good coupling to the device (high $\eta_C$) one method used in the prior art is to align the end of the input fiber with the device using precise piezoelectric motors, whose positioning is controlled by a feedback mechanism based on the output level resulting from a probe illumination beam used to align the fiber end. Either of these systems is complex, costly, and slow to operate. Alternatively, the fiber end is roughly fixed relative to the device, and the light is focused onto the SNSPD device in the cryostat. These methods may result is light losses of the order of 50% or more.

A photon impinging upon the detector has a limited chance of being absorbed by the nanowire structure of the detector, because of the partially transparent nature of the thin layer of detector superconductor. In order to increase the value of the pulse absorption efficiency, $\eta_A$, it has been proposed in a number of prior art references to use an optical cavity, with the detector element itself acting as one mirror and a second metallic mirror disposed opposite it, or with a simple reflective element added opposite the detector element. Thus, for instance, in the article entitled "An Ultra-low Dark-count and Jitter, Superconducting Single Photon Detector for Emission Timing Analysis of Integrated Circuits" by P. LeCoupanec et al., published in Microelectronics Reliability, Vol. 43, pp. 1621-1626 (2003), an aluminum mirror is deposited onto the SSPD active area, to retro-reflect photons transmitted through the NbN layer, to increase its apparent thickness. In U.S. Pat. No. 6,812,464 to R. Sobolewski et al, for "Superconducting Single Photon Detector", a concave mirrored surface is used to reflect and focus any photons which have passed through the SNSPD element without being absorbed, back onto the SNSPD element. In the article entitled "Nanowire Single Photon Detector with an Integrated Optical Cavity and Antireflection Coating" by K. M. Rosfjord et al, published in Optics Express, Vol. 14, No. 2, pp. 527-534 (2006), there is described an optical cavity fabricated on top of the detector structure, using a titanium/gold mirror on the detector surface remote from the optical input surface.

In general, these cavities have resulted in only a modest increase in the detection efficiency presumably because the detector element itself has a substantially transparent section. Moreover, the light is not generally confined in the directions perpendicular to the beam propagation direction, which result in light loss to the sides. As such the cavities produced have low finesse; the number of traverses of a photon within the cavity before it escapes without being absorbed by the NbN meander element is limited.

Furthermore, the above described prior art devices still require a sensitive and time consuming alignment procedure to ensure that the light input fall entirely on the SNSPD element.

There therefore exists a need for novel low light level detection devices, and especially SNSPD devices which overcome at least some of the disadvantages of presently available detectors.

The disclosures of each of the publications mentioned in this section and in other sections of the specification, are hereby incorporated by reference, each in its entirety.

SUMMARY

The present disclosure describes new exemplary light detection devices, especially using SNSPD detection elements, having novel configurations for increasing the detector efficiency. Firstly, the detector is fabricated directly on the tip of an optical fiber used for inputting the light. The fabrication on the tip of the fiber allows precise alignment of the detector to the fiber core, where the field mode is maximal. This construction maximizes the coupling efficiency $\eta_C$ to close to unity, without the need for complex alignment procedures, as is necessary with prior art devices in which the input fiber is brought into proximity and aligned with a previously fabricated device.

Additionally, the device can be constructed to include a high-Q optical cavity, such that any photon entering the device will be reflected to and fro within the cavity numerous times. This is achieved by ensuring that both end reflectors of the resonant optical cavity are mirrors having as high a reflectivity as possible. This construction is achieved by incorporating dedicated mirrors at both ends of the cavity, rather than using the nanowire structure itself, or a reflective coating on it, as one of the cavity mirrors, which is the configuration shown in at least some of the prior art. The cavity is thus characterized in that the meander nanowire structure is contained within the cavity between the end mirrors. Therefore, the above mentioned effect of photons being reflected to and fro within the cavity numerous times, and traversing the meander nanowire structure at every pass, thus results in their having greatly increased chances of absorption by the nanowire structure.

Such an optical cavity can be constructed in one of two configurations. In the first configuration, the mirror at the output end of the fiber, which is thus the input end of the cavity, may be a dielectric fiber Bragg grating mirror (FBG) having a very high reflectivity over a narrow band centered on the wavelength of the photons to be detected. This configuration provides a very high absorption probability of an impinging photon, approaching essentially unity. In the second configuration, the mirror at the output end of the fiber may be a partially transmitting mirror, such as a silver mirror of suitable thickness.

In either of these two configurations, the second mirror of the cavity should preferably be a full reflector mirror, having as high a reflectivity as possible. When the chance of a photon to pass through the first mirror is equal to the chance of it being absorbed in the detector, the cavity is said to be in critical coupling. Control over the first mirror, whether dielectric or metallic, allows engineering of the cavity to have what is known as critical coupling. When the critical coupling condition is fulfilled, optical physics predicts that light traveling with the resonance wavelength of the cavity will be fully absorbed in the cavity, hence the absorption efficiency $\eta_A$ becomes close to unity. Therefore, with the exception of the pulse efficiency $\eta_P$, which is a property of the nanowire structure and its operating conditions, all of the efficiencies concerned can be maximized to be close to unity, such that the proposed detector should allow a great increase in the detection efficiency.

The extent to which the coupling is close to critical is determined for these devices, inter alia, by the reflectivity level of the first mirror, according to the requirements of the detector. The closer the coupling is to critical, the higher the detection efficiency achieved, but generally, the more wavelength selective is the detector.

The intra-fiber construction in combination with the optical cavity has the added advantage in that for the majority of its passage along the cavity, the light is essentially confined by the fiber, such that no photons are lost by divergence away from the optical input axis. This feature is important for a high-Q cavity, where a photon may perform many traverses before it is absorbed by the nanowire structure.

Although this disclosure uses the example of the superconductor nanowire structure as the detection element for the novel detector device configurations described—the SNSPD devices being probably the most sensitive types currently available—it is to be understood that this is only one possible implementation of such detector devices described herewithin, and that this application is not intended to be limited for use only with a superconductor nanowire detector element. In effect, any suitable detector element may be used in the configurations described, on condition that such elements can be readily formed on the end of the input fiber, preferably by means of a planar deposition process, or on condition that they do not absorb light to such an extent that the Q-factor of the resonant optical cavity is reduced too much. One example of such a detection element is a bolometer, which can be readily deposited by thin film processes, and can be made sufficiently thin that it does not damp the resonant cavity too much.

There is thus provided in accordance with one exemplary implementation of the devices described in this disclosure, a superconducting nanowire detector device, comprising:
(i) a section of optical fiber for inputting an optical signal to be detected, and
(ii) an optical cavity associated with the end of the optical fiber, the cavity comprising serially:
 (a) a first reflective element,
 (b) a superconductive nanowire meander structure, which, when cooled to its operating temperature, is adapted to provide a detector output signal responsive to the incidence of photons, and
 (c) a high reflectivity mirror disposed at the end of the cavity remote from the optical fiber,
wherein the optical cavity is constructed such that it provides coupling close to critical for light incident thereon from the input fiber. In such a detector device, the coupling of light incident from the input fiber into the cavity may be sufficiently close to critical coupling that the light has a likelihood of at least 80% that it will be absorbed in the cavity.

Furthermore, in such detector devices, the first reflective element may be either a Bragg Grating Mirror formed within the optical fiber, or a partially transmitting metallic mirror, formed on the end of the optical fiber. Advantageously, the second reflective element should be an essentially fully reflective metallic or dielectric mirror. In such exemplary implementations of the above described detector devices, the cavity may be constructed to have a Q of at least 10, or of at least 100, or even more. In any of the described implementation of such detector devices, the superconductive nanowire detector structure may be formed directly on the end of said input fiber and in a location such that it is essentially aligned with the core of said fiber. Additionally, at least the superconductive nanowire detector structure and the high reflectivity mirror may be formed using planar deposition and lithographical processes.

Yet other implementations of the superconducting nanowire single photon detector devices described in this disclosure may comprise:

(i) a section of optical fiber for inputting an optical signal to be detected, and (ii) a superconductive nanowire detector structure, which, when cooled to its operating temperature, is adapted to provide a detector output signal responsive to the incidence of photons from the input fiber, wherein the superconductive nanowire detection structure is formed directly on the end of the input fiber in a location such that it is essentially aligned with the core of the fiber. In such an exemplary device, the superconductive nanowire detection structure may be formed using planar deposition and lithographical processes.

The above described other implementations may further comprise an optical cavity associated with the end of the input fiber, wherein the superconductive nanowire detector structure may be contained within the optical cavity. This optical cavity should comprise a first reflective element at the optical fiber end of the cavity and a high reflectivity mirror at the end of the cavity remote from the optical fiber. The first reflective element may be either a Bragg Grating Mirror formed within the optical fiber, or a partially transmitting metallic mirror, formed on the end of the optical fiber.

Yet other exemplary implementations perform a method of constructing a superconducting nanowire single photon detector device, comprising:

(i) providing a section of input optical fiber for inputting an optical signal to be detected, and (ii) forming directly on the end of the fiber in a location that is laterally aligned with the core of the fiber, a superconductive nanowire detector, which, when cooled to its operating temperature, provides a detector output signal responsive to the input of photons through the input fiber.

This method may further comprise the step of providing an optical cavity on the end of the fiber, wherein the superconductive nanowire detector is disposed within the optical cavity. In such a case, the optical cavity may comprise (a) either a Bragg Grating Mirror formed in the end section of the optical fiber or a partially transmitting mirror formed on the end of the optical fiber as the first cavity mirror, and (b) a high reflectivity mirror as the second cavity mirror.

In any such methods, the direct forming of the superconductive nanowire detector on the end of the fiber may be operative to optimize the coupling of the optical signal to the superconductive nanowire detector. Furthermore, such optimizing of the coupling may provide increased coupling of the optical signal to the superconductive nanowire detector compared to superconductive nanowire detectors disposed discretely on the end of the input fiber.

Such optimizing of the coupling may provide increased coupling of the optical signal to the superconductive nanowire detector compared to a superconductive nanowire detector disposed discretely on the end of the input fiber. Additionally, the optimizing of the coupling may provide increased coupling of the optical signal to the superconductive nanowire detector compared to a superconductive nanowire detector disposed outside of the optical cavity.

BRIEF DESCRIPTION OF THE DRAWINGS

The present invention will be understood and appreciated more fully from the following detailed description, taken in conjunction with the drawings in which:

FIGS. 1A to 1C illustrate schematically a prior art SNSPD incorporating an optical cavity on top of the nanowire meander device;

DETAILED DESCRIPTION

Figure 2:
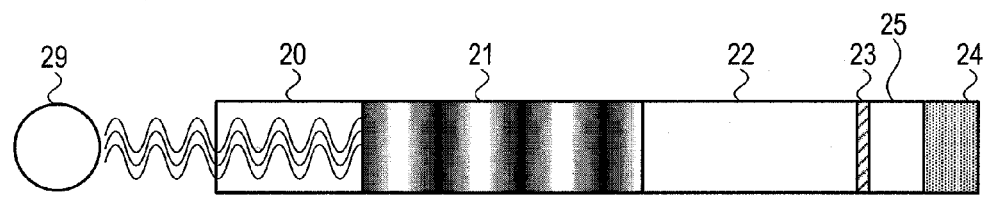
FIG. 2 illustrates schematically a first exemplary implementation of an SNSPD device of the type described in the present application, using a Bragg grating mirror as the input mirror to the optical cavity.

Reference is now made to FIGS. 1A, 1B and 1C, which illustrate schematically a prior art SNSPD, of the type shown in the above referenced article entitled "Nanowire Single Photon Detector with an Integrated Optical Cavity and Antireflection Coating" by K. M. Rosfjord et al, published in Optics Express, Vol. 14, No. 2, pp. 527-534 (2006). FIG. 1A is a schematic representation of the device, and FIG. 1B is a representation of a transmission electron micrograph of the cross-section of such a fabricated device. The light is input to the device by coupling from the end of a fiber optical feed 10, through an antireflection coating (ARC) 11 at the optical input surface to reduce loss of photons from reflection at this surface. The NbN nanowire device 12, as shown schematically in FIG. 1C, is formed on a sapphire ($Al_2O_3$) substrate 13, and on top of it, the optical cavity is formed of a Hydrogen silsesquioxane (HSQ) dielectric layer 14 with a high reflective Ti/Au mirror layer 15 deposited on top of it. Electrical connection to the NbN nanowire device 12 is made through contact pads 16. Because of the level of transparency of the NbN meander device 12, the reflection from which may be of the order of 30% or less, the finesse of such a cavity is limited. Results obtained showed an increase in the average measured detection efficiency of devices cooled to 1.8° K and at 1550 nm from 18% for the bare device to 48% for the improved device with cavity and ARC. This implies that the Q of the cavity formed is low, probably having a value of the order of less than 5.

Reference is now made to FIG. 2, which illustrates schematically a first exemplary implementation of an SNSPD device of the type described in the present application. The light from the source 29 being measured may be transferred by means of an optical fiber 20, and the output end of the input fiber 20 incorporates an integral Bragg grating mirror 21 near its end face, with a short stub section of fiber 22 spliced onto the output end of the Bragg grating mirror. The function of this short additional section will be described hereinbelow. The nanowire detector 23 is formed directly on the output face of the fiber assembly. The construction may be most readily formed by inserting the input fiber into a fiber optical connector, with the Bragg grating mirror at the inner end, and the short section of fiber spliced onto the output end of the Bragg grating mirror. A protective layer may be formed on top of the nanowire detector. Although the fiber component of the structure shown in FIG. 2 includes separate sections comprising the input fiber itself, the Bragg grating mirror, and the stub section of fiber, all of these segments are described in this disclosure to constitute the "input fiber", with the nanowire structure being formed on the end of this "input fiber". Although the SNSPD devices are generally described in this disclosure using nanowire structures made of NbN, this being one of the currently commonly used and cost effective materials, it is to be understood that the devices are not meant to be limited to use of NbN, but that any suitable superconducting material, such as TiNbN, $W_xSi_{1-x}$ or others, is also intended to be covered by this application.

The construction of the NbN nanowire structure directly on the end of the input fiber provides the significant advantages over prior art detectors, in which the NbN nanowire detector is constructed on a separate chip which is then attached to the end of the optical input fiber and aligned as best as possible, which results in potentially reduced coupling efficiency and complex alignment procedures. The construction of the NbN nanowire structure directly on the end of the input fiber results in tight coupling of the input photons from the center of the fiber core, where the field amplitude is maximal, onto the center of the nanowire structure. Furthermore, since the device, which has an overall length of about 2 cm, is formed within the fiber, with the exception of the few nm thickness of the nanowire structure and any protective layer, the light is confined by the fiber, and no incident photons can be lost by escaping in directions perpendicular to the fiber axis.

The advantages of forming the nanowire detector structure directly on the end of fiber can be compounded by means of a further improvement in which the detector structure on the end of the fiber is built inside an optical cavity having a high Q-factor. The cavity comprises the fiber Bragg grating mirror 21 at its input end, which can have a reflectivity in its pass band as determined by the FBG characteristics, of up to 99.99%, or even more. Such fiber implanted Bragg grating mirrors can be supplied by O/E Land Inc. of LaSalle, Quebec, Canada. At the remote end of the cavity, beyond the nanowire structure 23, a full reflector 24 is used, which too can have a reflectivity of well over 99%. This remote mirror is shown in FIG. 2 as a silver mirror, having a reflectivity of up to 99.6% at wavelengths in the 1550 nm. region. An intermediate buffer layer of a dielectric 25, shown in FIG. 2 as silicon dioxide, electrically insulates the silver mirror 24 from the nanowire structure 23 and its electrical connections. Any other suitable high reflectivity mirror may be used, and in particular metallic or dielectric mirrors. Use of such FBG mirrors together with end mirrors having such high reflectivities enables cavities to be obtained having Q-values of well over 100, and even 1000 or more.

As previously stated, the extent to which the cavity coupling is close to critical is determined, inter alia, by the reflectivity level of the input mirror, according to the requirements of the detector. The closer the coupling is to critical, the more sensitive is the detector, but generally, the less broadband is the detector. Thus, closeness to critical coupling is a characteristic of the device which is selected in accordance with the ultimate detection sensitivity desired, and the spectral breadth desired. Thus, the devices shown in FIG. 2 with the very high Q cavities will have a detection efficiency much closer to 100% than those to be described hereinbelow in FIG. 4, but will have much higher wavelength detection specificity.

In the implementation shown in FIG. 2, the total length of the cavity may need to be as much as a few centimeters, for the following reasons:

(A) In order to achieve a high reflectivity for the Bragg grating mirror and to fit critical coupling requirements, it may need to have a length of the order of 0.1 to 2 cm. or even more.

(B) The spacing, $\Delta\lambda$, between sequential resonance wavelengths is approximately given by the formula:

$$\Delta\lambda = \lambda^2/L \quad (1)$$

where $\lambda$ is the wavelength and L is the cavity length. In one exemplary implementation, the FBG used is centered on $\lambda$=1550 nm, and has a high-reflectivity bandwidth of only 0.2 nm. In order to operate practically with such a narrow bandpass mirror such that at least a few cavity resonance wavelengths will be in the narrow bandpass ($\Delta\lambda$<0.2 nm), a long cavity is needed, which from equation (1) is found to be of the order of $(1550 \text{ nm})^2/0.2$ nm=1.2 cm. This is achieved by adding a fiber stub 22 to the cavity, typically of length between 0.25 to 2 cm, depending on the bandwidth of the FBG, such that the total cavity length (FBG+Stub) may be of the order of up to a few centimeters.

A cavity of this length has a further advantage, in that almost the entire length of the cavity, up to the nanowire structure itself, is contained within the optical fiber. The only parts of the cavity which are outside of the effective fiber length are the nanowire device 23, typically of the order of 4 nm, the buffer layer 25, typically 150 nm, and the end mirror 24, typically 150 nm. Thus the majority of the cavity length is within the confines of the fiber. The light traversing within that length of fiber is confined to the fiber and cannot escape in directions perpendicular to the light propagation direction. The only region of the cavity where light can escape is therefore the approximately 300 nm end section. Because of the excellent confinement along the propagation direction, there is therefore very little loss due to light escaping from the sides of the cavity. Calculations show that such losses for a cavity having the dimensions and properties mentioned herewithin can be as small as $10^{-6}$ or even less. This is a substantive improvement over prior art cavities, where the propagation is performed in free space and not within a fiber medium. Thus even if the prior art cavities described hereinabove were capable of being constructed with considerably higher Q values (which does not seem readily achievable because of the use of the nanowire structure as the basis of one of the mirrors), the efficiencies of the detectors thereby achieved would still not approach those of the devices of the present disclosure, because of their losses of photons laterally from the cavity.

Figure 3:
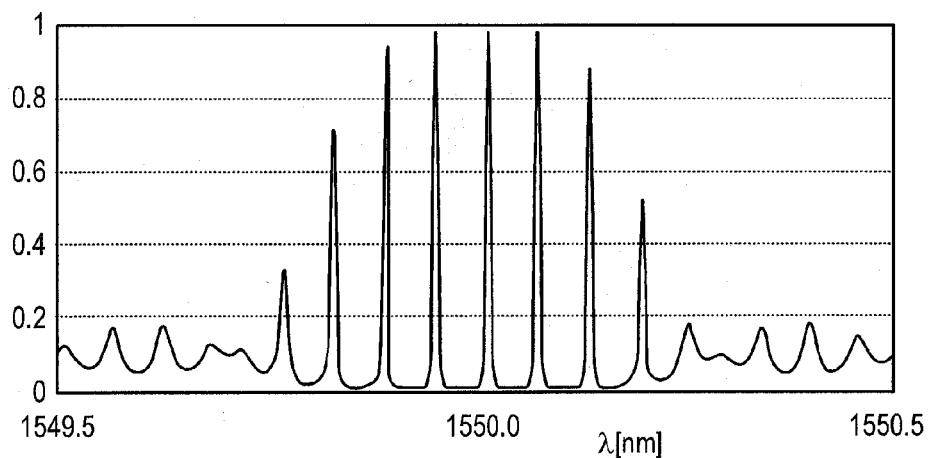
FIG. 3 illustrates schematically a plot of the optical absorption in a cavity such as that shown in the device of FIG. 2, as a function of the wavelength of the incident light.

Reference is now made to FIG. 3, which illustrates schematically a plot of the optical absorption coefficient in a cavity such as that shown in the device of FIG. 2, as a function of the wavelength $\lambda$ of the incident light. As explained above, the cavity is said to be critically coupled when the reflection component is zero and the absorption coefficient is unity, such that all of the light enters the cavity and none is returned. Since the dielectric buffer layers have a very low absorption, the incident light is absorbed within the cavity either in the detector or the silver mirror. Since in a single pass, the absorption in the silver mirror is less than 0.5% whereas the absorption in the detector is of the order of 10% it is clear that most of the light is absorbed in the detector, as is desired of the device. This is the optimal case for such a cavity implemented detector.

The exemplary cavity whose plot is shown in FIG. 3 has critical coupling at a number of wavelengths within the 0.2 nm. passband of the FBG used in the device. The parameters for this exemplary cavity are:

$n_{Ag}=0.514+i*20.8$ $n_{NbN}=5.23+i*5.82$ $n_{SiO2}=1.5$

The detector fill factor over the beam area=0.3
FBG length, L=0.32 cm.
FBG maximal wavelength bandpass=0.2 nm.
Cavity length, $d_{SiO2}$=1.2 cm.

where the n are the complex refractive indices of the materials involved, and the other terms are self explanatory. For such a cavity, critical coupling is achieved for wavelengths λ of 1549.893; 1549.955; 1550.017 and 1550.080 nm.

Figure 4:
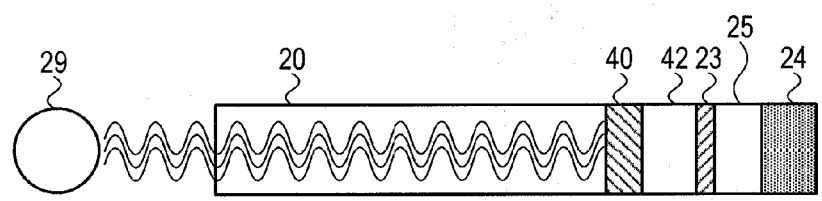
FIG. 4 illustrates schematically another exemplary implementation of an SNSPD device, similar to that of FIG. 2, but using a semitransparent mirror as the input to the cavity.

Reference is now made to FIG. 4, which illustrates schematically another exemplary implementation of an SNSPD device of the type described in the present application. The drawing of FIGS. 2 and 4 are not scale drawings, such that dimensioned comparisons should be made only from the exemplary dimensions given in their associated descriptions in this disclosure. Like FIG. 2, the implementation of FIG. 4 is achieved by forming the complete detector assembly with its associated optics, directly on the end of the input optical fiber 20. Furthermore, the implementation of FIG. 4 also utilizes a cavity with high reflection mirrors at its ends and with the nanowire device disposed within the cavity. However, unlike the implementation of FIG. 2, the high reflection mirror used at the input of the implementation shown in FIG. 4 is a conventional partially reflective mirror 40, enabling the input light to penetrate, but providing sufficient reflection to ensure critical coupling to the cavity. The extent to which the coupling is close to critical is determined, inter alia, by the reflectivity level of the input mirror, according to the requirements of the detector. The closer the coupling is to critical, the more sensitive is the detector, but generally, the less broadband is the detector. Thus, coupling which ensures that, for instance, at least 80%, or 90% or 95% or 99% or even more of the incident light is absorbed in the cavity, will result in detectors having different sensitivities and for different spectral breadth use.

On top of the partially reflective mirror 40, a buffer layer of dielectric 42 is deposited, to electrically insulate the nanowire detector structure 23 from the input mirror. This layer is shown exemplarily in FIG. 4 as silicon dioxide. This is followed by the nanowire detector structure 23, followed by another buffer dielectric layer 25. The total thickness of the two $SiO_2$ layers should be selected so that the cavity will support the light wavelength to be detected. It may typically be a few μm thick, or more. The outer high reflection mirror follows, shown in FIG. 4 too as a silver mirror 24. Since all of the manufacturing steps are performed by planar depositions on the end of the fiber, the construction of this implementation is therefore simpler and less costly than that of FIG. 2. However, since the cavity is essentially entirely in free space, since the fiber terminates at the partially silvered mirror 40 and the buffer layer of dielectric 42 does not necessarily efficiently contain the light, even though the cavity is short, the losses due to escape of photons laterally from the cavity are higher than those of the implementation of FIG. 2, where almost the entire cavity, up to the nanowire detector, is contained within the fiber structure. Furthermore, as mentioned above, since the Q of the cavity is lower, and the cavity significantly shorter than that of FIG. 2, this type of detector will generally have a broader wavelength response than those of FIG. 2. This type of detector may thus be more useful for biological and astronomical detection applications, where the light to be detected does not have the same sharply predetermined defined wavelengths as are common in telecommunication applications with their closely controlled channel frequencies.

Reference is now made to FIGS. 5A to 5G, which illustrate schematically one exemplary method by which an SNSPD of the type shown in FIG. 2 can be constructed. Although the particular steps are described as performed in a laboratory environment, and should not therefore be taken as limiting production methods of such devices, similar steps can be adapted for commercial industrial production use.

Figure 5A:
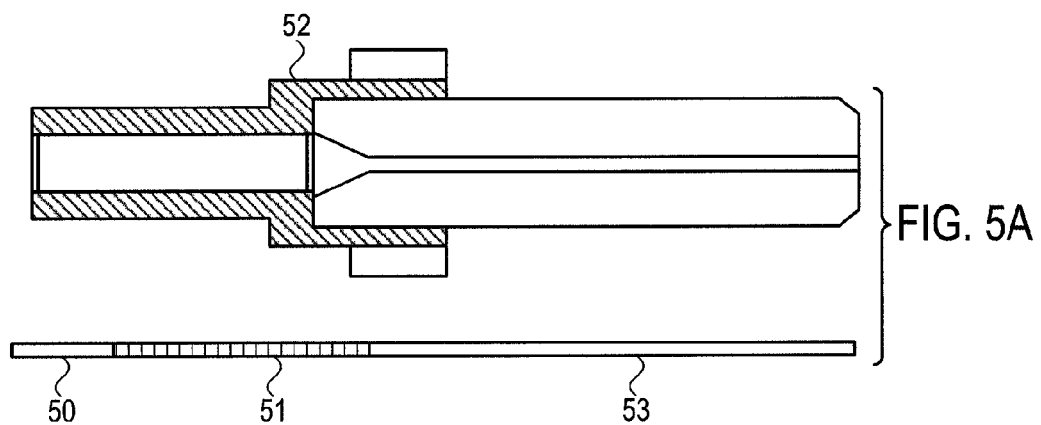
FIGS. 5A to 5G, illustrate schematically one exemplary method by which an SNSPD of the type shown in FIG. 2 can be constructed.

In order to fabricate the detector, a standard ferule Fiber Connector (FC) 52 is used as a base substrate. FIG. 5A shows, in side cut-away view, an input fiber 50 in the form of a section of fiber having the selected Fiber Bragg Grating, 51, near its extremity, and the FC 52 into which the fiber is to be inserted. The fiber is chosen to suit the wavelength of the photons needed to be detected. Such a fiber may be Corning SM-28, which has an 8.2 μm core, and a 125 μm cladding layer, with a 10.4 μm mode field diameter, this being suited to transmission of 1550 nm wavelength light. Other fibers may be well selected for visible light, or for other telecommunication wavelengths or for any other wavelength. The section of clear fiber 53 beyond the FBG 51 is selected to fulfill the cavity length requirement as previously discussed, for the ultimate cavity configuration.

Figure 5B:
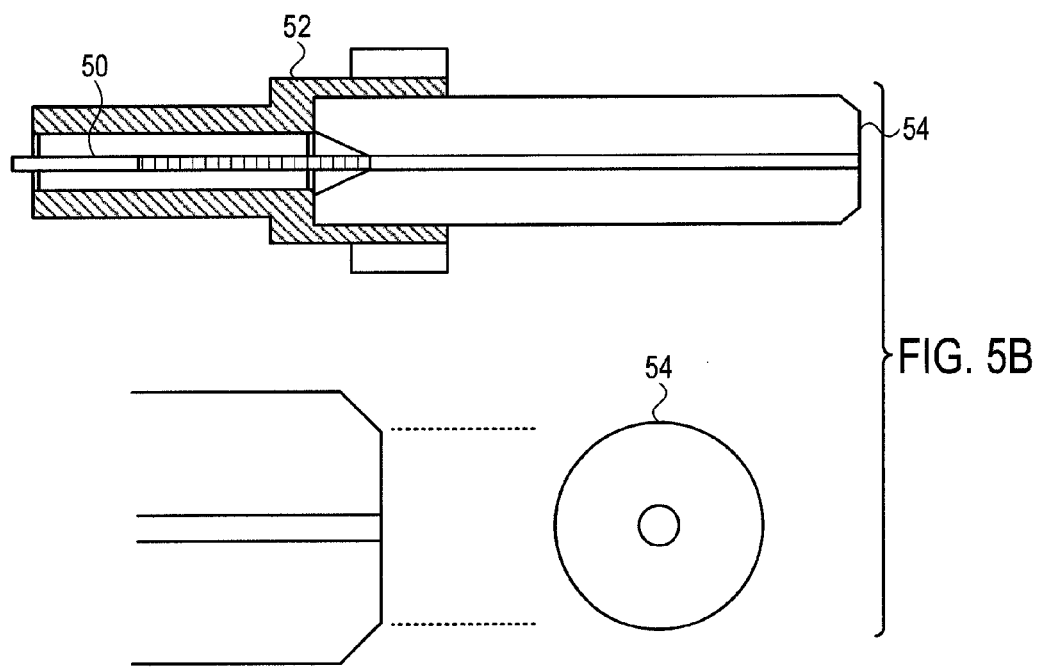

In FIG. 5B, the fiber is shown inserted into the FC 52 to a depth such that the end of the fiber protrudes very slightly beyond the output face 54 of the fiber connector FC, though because of the scale of the drawing, this protrusion is not apparent in FIG. 5B. The fiber may then be epoxy glued to the FC, as is known in standard fiber optical fabrication techniques, and the overhang of the fiber polished to ensure the "ultra high polish" quality needed for the ensuing fabrication steps (known as FC-UPC). The bottom section of FIG. 5B shows an enlarged representation of the end of the FC, in section and end view of the face 54.

FIGS. 5C to 5G now illustrate schematically, the various planar deposition and fabrication steps carried out on the end of the installed fiber, according to one exemplary procedure used, in order to construct the device. These steps are also shown on the right hand side of each drawing, in end views of the FC and fiber assembly.

Figure 5C:
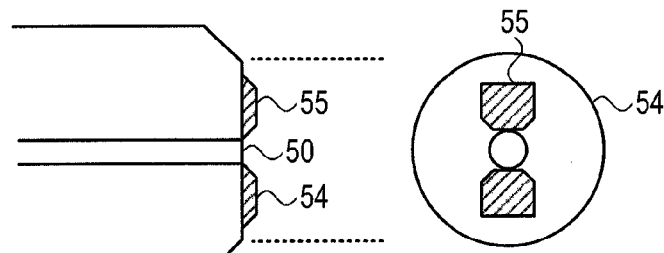

In FIG. 5C, the gold contact layers 55, are shown evaporated onto the end face 54 of the FC and the fiber, preceded by a thin chromium layer (not shown) to provide good adhesion of the gold. The leads are evaporated in such way that the ferrule-fiber interface is fully covered by this thick layer, but the core of the fiber 50 is clear, to enable the light input from the fiber core to reach the nanowire detector element. Evaporation is most readily performed through a mechanical mask to enable the shaped profile to be formed, the broad wings 55 at top and bottom of the drawing being used to facilitate ultimate electrical connection by wire bonding to the coaxial cable connector for output of the signal.

Figure 5D:
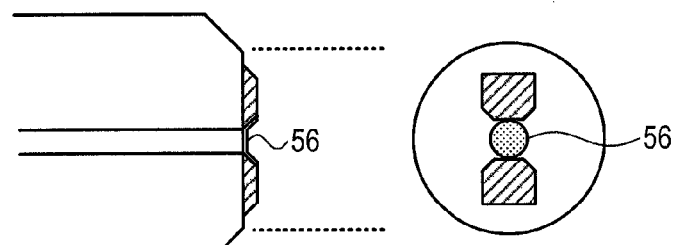

In FIG. 5D, a layer 56 of the superconductive nanowire material is sputtered over the fiber end, most conveniently Niobium Nitride, NbN. The sputtering may be performed using a DC-magnetron sputtering system at room temperature from a Niobium target with a partial pressure of Ar and N gasses, as is known in the art. Typical sputtering parameters used may be a base pressure of $1\sim2\times10^{-7}$ Torr, a working pressure of $5\times10^{-3}$ Torr, relative Ar—N partial pressure of 5:1, a discharge current of 900 mA, a discharge voltage of 200 V, a deposition rate of 5 Å/sec, and a target-substrate distance of 140 mm. On top of the NbN layer, a thick aluminum layer is deposited in order to protect the NbN layer during the following focused ion-beam lithography process shown in FIG. 5E.

Figure 5E:
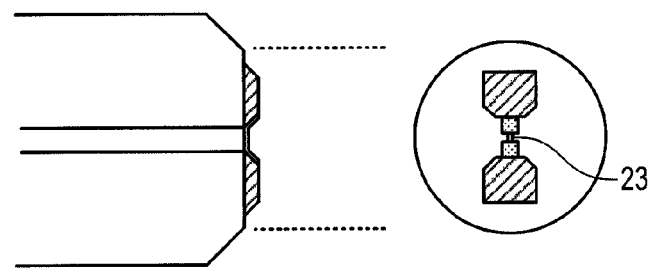

In FIG. 5E, using focused ion beam (FIB) milling, the meander nanowire structure (23 of FIGS. 2 and 4) is then fabricated in the NbN layer. The actual size of this structure is too small to be seen in FIG. 5E, but its position is indicated thereon. According to one exemplary procedure, the sample may undergo a first lithography step using FIB, where the NbN is narrowed to a 25 μm width and 150 μm length bridge. The purpose of this step is to reduce the capacitance between the NbN layer and the nearby metallic mirrors. This step is done using a high current and at relatively low precision (1 μm). During this step, the Al mask layer protects the NbN film from exposure to the ion beam, and prevents Gallium poisoning of the layer, as is known in the art. At the end of the first photolithography step, the Al layer is completely removed using TMAH-DI (1:10) solution. The sample then undergoes a second FIB step, this time with low current and high precision (<10 nm), and the precision meander is formed. The size of the meander conductors so formed may be such that each line may exemplarily be 5 nm thick and 100 nm wide, and the meander covers a circle of at least the diameter of the mean optical mode.

An alternative to the process described in connection with FIG. 5E could be to remove the Al layer and then to perform photo-lithography or Electron Beam (e-beam) lithography. Such steps may require the deposition of photo- or e-beam resists, on a non-planar substrate (the end of the FC connector). Such methods known in the art include spray coating, drop casting, spin coating and other methods. Imposing such a photolithography step will require a machine operating at short wavelengths (deep-UV region) to achieve the required 100 nm resolution limit Achieving a resolution of 100 nm or less using e-beam lithography is a practice known in the art. The lithography step may then be sequentially followed by chemical dry etching procedures, which are well established, using gasses such as $CF_4$ or $SF_6$ or others, in an electron cyclotron resonance machine (ECR) or reactive ion etching (RIE) or ion milling or another suitable type of machine.

For all methods of lithography (FIB, e-beam lithography, photolithography or any other) an alignment of the nanowire to the fiber core is necessary. Such alignment may be achieved using the circumference of the fiber. Since the fiber has a defined diameter, and its shape is an accurate circle, it may be used to find the center of the fiber. The fiber and the fiber core are concentric circles, hence have common centers. Once the position of the center of the core is found, the meander can be formed accurately aligned to this core.

Figure 5F:
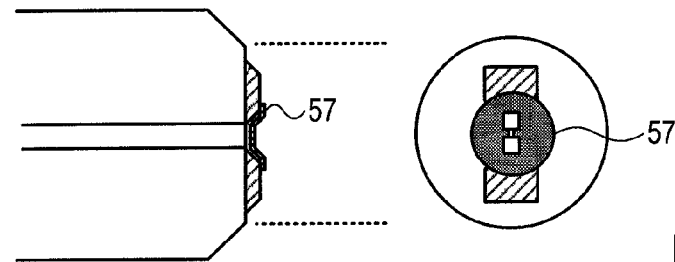
Figure 5G:
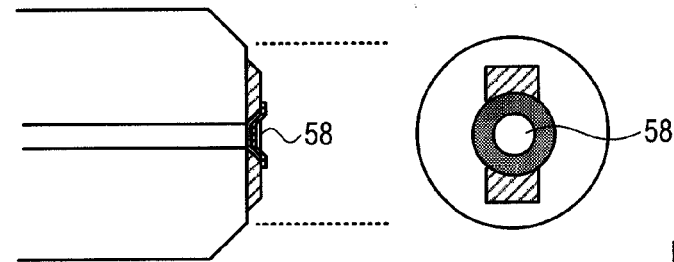

In the step shown in FIG. 5F, a cap layer of $SiO_2$ 57, typically of thickness 150 nm, is thermally evaporated through a mechanical mask, in order to provide the electrically insulating buffer layer before applying the silver mirror shown in FIG. 5G. Since the $SiO_2$ is optically transparent (glass), the NbN underlayer is still visible through it.

In FIG. 5G, the top silver mirror 58, also typically of thickness 150 nm, is thermally evaporated over the center section of the $SiO_2$ layer, to provide the end mirror of the device optical cavity. The NbN underlayer is now no longer visible through the opaque mirror.

For constructing the implementation shown in FIG. 4, using a semitransparent metallic mirror instead of an FBG mirror, the initial steps of FIGS. 5A and 5B are the same, except that a standard single mode fiber is used for inputting the light to the device. As before, the fiber should be selected to suit the light wavelength to be transmitted. After gluing and polishing, a layer of silver is evaporated onto the ferrule end face, having a predetermined thickness determined by the reflection/transmission ratio needed for the cavity. This mirror should then be covered by an evaporated dielectric layer, such as $SiO_2$ to avoid shorting of the following detector by the mirror, and to ensure correct cavity length. Production then continues with deposition and fabrication of the NbN nanowire detector element and successive layers, as described in the steps shown in FIGS. 5C to 5G hereinabove.

It is appreciated by persons skilled in the art that the present invention is not limited by what has been particularly shown and described hereinabove. Rather the scope of the present invention includes both combinations and sub-combinations of various features described hereinabove as well as variations and modifications thereto which would occur to a person of skill in the art upon reading the above description and which are not in the prior art.

We claim:

1. A superconducting nanowire detector device, comprising:
    a section of input optical fiber for inputting an optical signal to be detected; and
    an optical cavity constructed at an end of said optical fiber, said cavity comprising serially:
        a first reflective element;
        a superconductive nanowire meander structure, which, when cooled to its operating temperature, is adapted to provide a detector output signal responsive to the incidence of photons; and
        a high reflectivity mirror disposed at the end of said cavity remote from said optical fiber,
    wherein the reflectivities of said first reflective element and of said high reflectivity mirror are such that coupling close to critical is obtained for light incident on said cavity from said input fiber.

2. A superconducting nanowire detector device according to claim 1, wherein coupling of light incident from said input fiber into said cavity is sufficiently close to critical coupling that said light has a likelihood of at least 80% that it will be absorbed in said cavity.

3. A superconducting nanowire detector device according to claim 1, wherein said first reflective element is a Bragg Grating Mirror formed within said optical fiber.

4. A superconducting nanowire detector device according to claim 1, wherein said first reflective element is a partially transmitting mirror, formed on the end of said optical fiber.

5. A superconducting nanowire detector device according to claim 1, wherein said high reflectivity mirror is an essentially fully reflective metallic mirror.

6. A superconducting nanowire detector device according to claim 1, wherein said high reflectivity mirror is an essentially fully reflective dielectric mirror.

7. A superconducting nanowire detector device according to claim 1, wherein said cavity is constructed to have a Q of at least 10.

8. A superconducting nanowire detector device according to claim 1, wherein said cavity is constructed to have a Q of at least 100.

9. A superconducting nanowire detector device according to claim 1, wherein said superconductive nanowire meander structure is formed directly on the end of said input fiber and in a location such that it is essentially aligned with the core of said fiber.

10. A superconducting nanowire detector device according to claim 1, wherein at least said superconductive nanowire meander structure and said high reflectivity mirror are formed using planar deposition and lithographical processes.

11. A superconducting nanowire detector device, comprising:
  a section of input optical fiber for inputting an optical signal to be detected; and
  a superconductive nanowire detector structure, which, when cooled to its operating temperature, is adapted to provide a detector output signal responsive to the incidence of photons from said input fiber,
  wherein said superconductive nanowire detector structure is formed within an optical cavity disposed directly at an end of said input fiber in a location such that it is aligned with the core of said fiber.

12. A superconducting nanowire detector device according to claim 11, wherein said superconductive nanowire detector structure is formed using planar deposition and lithographical processes.

13. A superconducting nanowire detector device according to claim 11, wherein said optical cavity comprises a first reflective element at the optical fiber end of said cavity and a high reflectivity mirror at an end of said cavity remote from said optical fiber.

14. A superconducting nanowire detector device according to claim 13, wherein said first reflective element is either of a Bragg Grating Mirror formed within said optical fiber, or a partially transmitting metallic mirror, formed on the end of said optical fiber.

15. A method of constructing a superconducting nanowire detector device, comprising:
  providing a section of input optical fiber for inputting an optical signal to be detected; and
  forming by a process performed directly on an end of said fiber, in a location that is axially aligned with the core of said fiber, a superconductive nanowire detector, which, when cooled to its operating temperature, provides a detector output signal responsive to the input of photons through said input fiber.

16. A method according to claim 15, further comprising the step of providing an optical cavity on the end of said fiber, wherein said superconductive nanowire detector is disposed within said optical cavity.

17. A method according to claim 16, wherein said optical cavity comprises (a) either a Bragg Grating Mirror formed in the end section of said optical fiber or a partially transmitting mirror formed on the end of said optical fiber, as a first cavity mirror, and (b) a high reflectivity mirror as a second cavity mirror.

18. A method according to claim 16, wherein said forming of said superconductive nanowire detector on the end of said fiber is operative to optimize the coupling of said optical signal to said superconductive nanowire detector.

19. A method according to claim 18, wherein said optimizing of said coupling provides increased coupling of said optical signal to said superconductive nanowire detector compared to a superconductive nanowire detector disposed discretely on the end of said input fiber.

20. A method according to claim 18, wherein said optimizing of said coupling provides increased coupling of said optical signal to said superconductive nanowire detector compared to a superconductive nanowire detector not disposed within said optical cavity.

21. A method according to claim 15, wherein said wherein said superconductive nanowire detector structure is formed using planar deposition and lithographical processes.

* * * * *